(12) United States Patent
Kwon

(10) Patent No.: US 7,718,477 B2
(45) Date of Patent: May 18, 2010

(54) SEMICONDUCTOR DEVICE AND METHOD OF FABRICATING THE SAME

(75) Inventor: Hyun Yul Kwon, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 118 days.

(21) Appl. No.: 11/964,350

(22) Filed: Dec. 26, 2007

(65) Prior Publication Data

US 2009/0001475 A1 Jan. 1, 2009

(30) Foreign Application Priority Data

Jun. 28, 2007 (KR) .................. 10-2007-064540

(51) Int. Cl.
*H01L 29/72* (2006.01)

(52) U.S. Cl. .................. 438/149; 438/152; 438/162; 438/166; 438/412; 438/480; 438/514

(58) Field of Classification Search .................. 438/149, 438/152, 162, 412, 480, 514
See application file for complete search history.

(56) References Cited

U.S. PATENT DOCUMENTS 6,433,389 B1 * 8/2002 Gieseke .................. 257/347

FOREIGN PATENT DOCUMENTS

JP 04-072770 3/1992

* cited by examiner

*Primary Examiner*—Edward Wojciechowicz
(74) *Attorney, Agent, or Firm*—Marshall, Gerstein & Borun LLP

(57) ABSTRACT

This patent relates to a semiconductor device and a method of fabricating a semiconductor device. The semiconductor device includes an insulating layer formed in a semiconductor substrate, trenches formed within the insulating layer, silicon layers formed within the trenches, gates formed on the silicon layers, and junctions formed in the silicon layers at both sides of the gates.

12 Claims, 3 Drawing Sheets

SEMICONDUCTOR DEVICE AND METHOD OF FABRICATING THE SAME

CROSS-REFERENCES TO RELATED APPLICATIONS

This patent claims priority to Korean patent application No. 10-2007-064540, filed on Jun. 28, 2007, the disclosure of which is incorporated by reference in its entirety.

TECHNICAL FIELD

This patent relates to a method of fabricating a semiconductor device and, more particularly, to a method of fabricating a semiconductor device, in which a well with an improved isolation characteristic is formed.

BACKGROUND OF THE INVENTION

A semiconductor device may include a cell region and a peripheral region. A plurality of memory cells for storing data may be formed in the cell region. The peripheral region may include a plurality of transistors. In particular, a voltage applied to the transistors of the peripheral region may be higher than a voltage applied to the memory cells of the cell region. Thus, the transistors of the peripheral region may have an isolation characteristic greater than a well of the cell region. A transistor having a deep Shallow Trench Isolation (STI) and a wide well structure is provided. However, the deep STI and wide well structure make it difficult to form a photoresist pattern during a patterning process.

Generally, a semiconductor device having a Silicon-On-Insulator (SOI) structure may be fabricated in a semiconductor substrate to improve the isolation characteristic of the device. The SOI substrate includes a semiconductor substrate, an insulating layer, and a silicon layer formed on the insulating layer. The transistors formed on the SOI substrate may have an improved isolation characteristic, a latch-up free property, and a low junction capacity of a source/drain junction. In particular, a complete depletion type SOI transistor enables low power consumption and a high-speed operation, may be driven at a low voltage.

However, the silicon layer formed on the insulating layer may have micro defects, such as grain boundaries and micro twins, thus it is not suitable to form the transistors of a micro pattern such as memory cell.

BRIEF SUMMARY OF THE INVENTION

This patent is directed to an improved insulating characteristic between transistors to which a high voltage may be applied by forming a SOI structure in a peripheral region of a semiconductor substrate. Further, an increased level of integration may be provided by forming a narrow gap between adjacent junctions.

A semiconductor device according to an embodiment includes an insulating layer formed in a semiconductor substrate, trenches formed within the insulating layer, silicon layers formed within the trenches, gates formed on the silicon layers, and junctions formed in the silicon layers at both sides of the gates.

In an embodiment, the insulating layer may be formed in a peripheral region of the semiconductor substrate. A top surface of the semiconductor substrate, the insulating layer, and the silicon layers may be substantially flat.

A semiconductor device according to another embodiment includes an insulating layer formed in a semiconductor substrate, trenches formed within the insulating layer, wells formed within the trenches, gates formed on the wells, and junctions formed in the wells at both sides of the gates. The wells may include silicon layers into which ions are implanted.

A method of fabricating a semiconductor device according to an embodiment includes forming an insulating layer in a semiconductor substrate, forming trenches within the insulating layer, forming silicon layers within the trenches, forming gates on the silicon layers, and forming junctions in the silicon layers at both sides of the gates.

In an embodiment, the formation of the insulating layer may include forming a first mask pattern in which a peripheral region may be opened on the semiconductor substrate, forming the insulating layer by performing an ion implantation process on the semiconductor substrate exposed along the first mask pattern, removing the first mask pattern, and performing an annealing process. The ion implantation process may be performed using oxygen ions as an impurity.

In an embodiment, the formation of the trenches may include forming a second mask pattern in which an isolation region of a cell region and a peripheral region may be opened on the semiconductor substrate, performing an etch process on the second mask pattern in order to form the trenches in the cell region and the peripheral region, and removing the second mask pattern.

In an embodiment, a depth of the trenches formed in the peripheral region may be shallower than the trenches formed in the cell region during an etching process. The insulating layer may be formed in the peripheral region of the semiconductor substrate. When the gates are formed, memory cells may be formed in a cell region.

A method of fabricating a semiconductor device according to another embodiment includes forming an insulating layer in a semiconductor substrate, forming trenches within the insulating layer, forming wells within the trenches, forming gates on the wells, and forming junctions in the wells at both sides of the gates.

In an embodiment, the formation of the wells may include forming silicon layers within the trenches, and performing an ion implantation process on the silicon layers. The ion implantation process may include implanting a P type impurity.

BRIEF DESCRIPTION OF THE DRAWINGS

For a more complete understanding of the disclosure, reference should be made to the following detailed description and accompanying drawings wherein.

DETAILED DESCRIPTION

While the patent is not limited to the disclosed embodiments, but may be implemented in various manners. The embodiments are provided to complete the disclosure of the invention and to allow those having ordinary skill in the art to understand the scope of the invention defined by the appended claims.

FIGS. 1A to 1D are sectional views illustrating a method of fabricating a semiconductor device according to an embodiment of the invention.

Figure 1A:
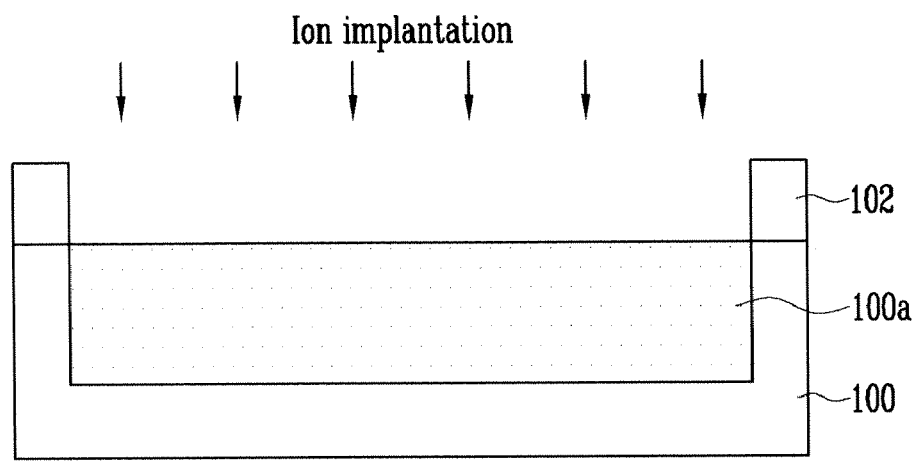
FIGS. 1A to 1D are sectional views illustrating a method of fabricating a semiconductor device according to an embodiment of the invention.

Referring to FIG. 1A, a peripheral region of a semiconductor substrate 100 may be opened and an insulating mask pattern 102 may be formed on the semiconductor substrate 100 in order to form a SOI structure. An ion implantation process may be performed on the insulating mask pattern 102 by using ions of an insulating component as an impurity. For example, oxygen ions may be implanted. As the insulating ions are implanted into the exposed semiconductor substrate 100, an insulating layer 100a may be formed within the semiconductor substrate 100. The insulating layer 100a may be, for example, buried oxide (BOX).

Though not shown in the drawing, an ion implantation process of implanting an N type impurity may be performed in order to form a Triple N Well (TNW) in a cell region of the semiconductor substrate 100. The semiconductor substrate 100 may be a P type and a subsequent P type well region may be formed.

Figure 1B:
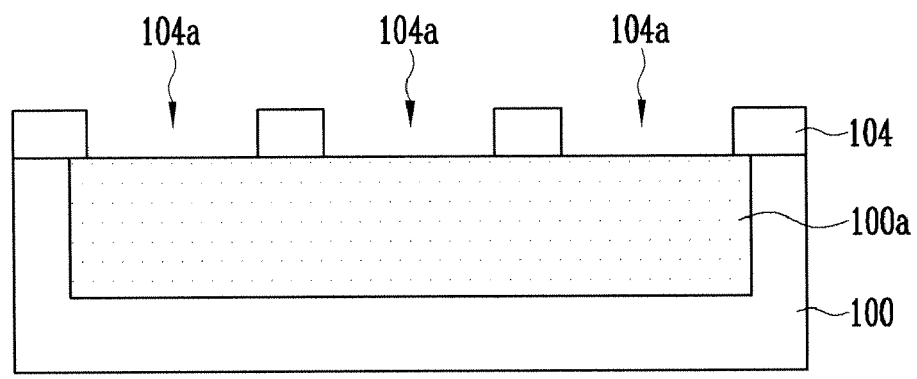

Referring to FIG. 1B, the insulating mask pattern 102 (as shown in FIG. 1A) may be removed and an annealing process may be performed in order to activate the ion implantation region. The annealing process may be performed in order to form a channel and a junction region in the peripheral region of the semiconductor substrate 100. As shown, a gate mask pattern 104 may be formed on the semiconductor substrate 100 leaving regions 104a exposed. Transistors may be formed in the regions 104a within the insulating layer 100a of the peripheral region may be opened. An opened pattern may be formed in an isolation region (not shown) of the cell region. Thus, the insulating layer 100a may be exposed in the region 104a in which the transistors of the peripheral region may be formed and the semiconductor substrate 100 may be exposed in the isolation region of the cell region.

Figure 1C:
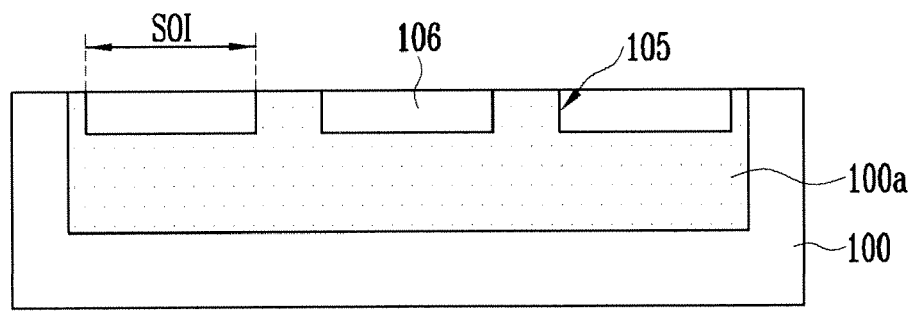

Referring to FIG. 1C, an etching process may be performed on the gate mask pattern 104 having the opened patterns in the cell region and the peripheral region. During the etching process, the TNW region may be etched in the semiconductor substrate 100 of the cell region and the insulating layer 100a may be etched in the semiconductor substrate 100 of the peripheral region. Thus, there is a difference in the etch rate occur due to a difference in the materials of the two regions. In particular, if the etching process having a high etching selectivity with respect to silicon (Si) is performed, the etch rate in the insulating layer 100a of the peripheral region may be slower than the etch rate in the cell region. Thus the insulating layer 100a may be etched to form a plurality of trenches 105 having a shallow and narrow structure. If deep and wide trenches are formed, a subsequent patterning process may become difficult. The gate mask pattern 104 (as shown in FIG. 1B) may be removed after the trenches are formed and silicon (Si) layers 106 may be formed within the trenches 105 of the peripheral region. Thereafter, a chemical mechanical polishing (CMP) may be performed in order to expose the insulating layer 100a between the silicon layers 106, thereby isolating the adjacent silicon layers 106. As shown, SOI structures may be formed locally in the semiconductor substrate 100. An ion implantation process of implanting a P type impurity, for example, using boron (B) may be performed on the semiconductor substrate 100 including the silicon layers 106 that are isolated from each other, in order to form P type wells.

Figure 1D:
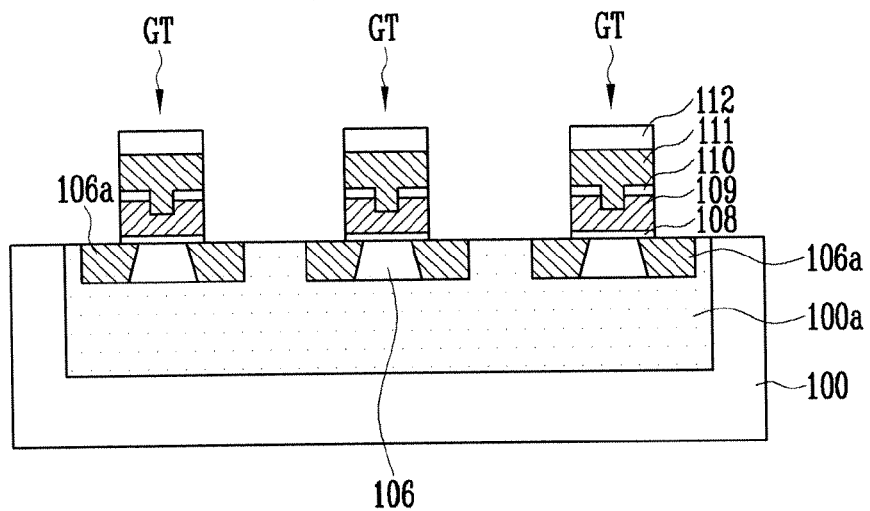

Referring to FIG. 1D, gates GT may be formed on the SOI structures of the semiconductor substrate 100. Each gate GT may be formed by laminating a gate insulating layer 108, a first conductive layer 109, a dielectric layer 110, a second conductive layer 111, and a metal layer 112. A contact hole may be formed in the dielectric layer 110 so that the first conductive layer 109 connects with the second conductive layer 111. Further, memory cells are formed in the cell region.

An ion implantation process using an N type impurity may be performed in order to form junctions 106a in the semiconductor substrate 100 in which the gate (GT) patterns may be formed. The junctions 106a formed in the silicon layers 106 may be exposed at both sides of the gate GT. Further, the junctions 106a formed in each silicon layer 106 may be isolated from each other by the insulating layer 100a. The silicon layers 106 below a transistor (TR) pattern becomes a channel region.

As shown, the respective transistors TR may be surrounded by the insulating layer 100a and respectively formed within the silicon layers 106 may be isolated from each other. Thus, the occurrence of capacitance between the junctions 106a may be prohibited. Further, since the silicon layers 106 and the junctions 106a in which the channels may be formed are surrounded by the insulating layer 100a, the leakage current at a high voltage transistor may be minimized.

FIGS. 2A to 2D are sectional views illustrating a method of fabricating a semiconductor device according to another embodiment of the invention.

Figure 2A:
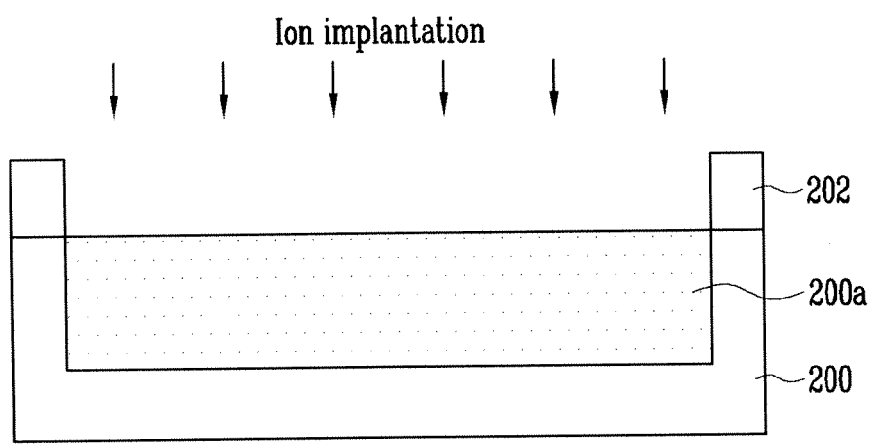
FIGS. 2A to 2D are sectional views illustrating a method of fabricating a semiconductor device according to another embodiment of the invention.

Referring to FIG. 2A, a peripheral region of a semiconductor substrate 200 may be opened and an insulating mask pattern 202 may be formed on the semiconductor substrate 200 in order to form a SOI structure. An ion implantation process may be performed on the insulating mask pattern 202 by using ions of an insulating component as an impurity. For example, oxygen ions may be implanted. As the insulating ions are implanted into the exposed semiconductor substrate 200, an insulating layer 200a may be formed within the semiconductor substrate 200. The insulating layer 200a may be, for example, BOX.

Though not shown in the drawing, an ion implantation process of implanting an N type impurity may be performed in order to form a TNW in a cell region of the semiconductor substrate 200. The semiconductor substrate 200 may be a P type a subsequent P type well region may be formed.

Figure 2B:
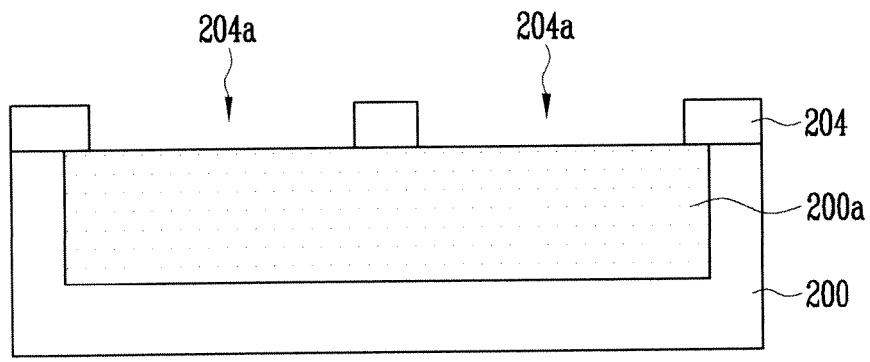

Referring to FIG. 2B, the insulating mask pattern 202 (as shown in FIG. 2A) may be removed and a mask pattern 204 may be formed in the peripheral region of the semiconductor substrate 200 using a process of forming wells. The mask pattern 204 includes a pattern in which regions having the wells may be formed subsequently within the insulating layer 200a of the peripheral region may be opened, and an isolation region (not shown) may be opened in the cell region.

Figure 2C:
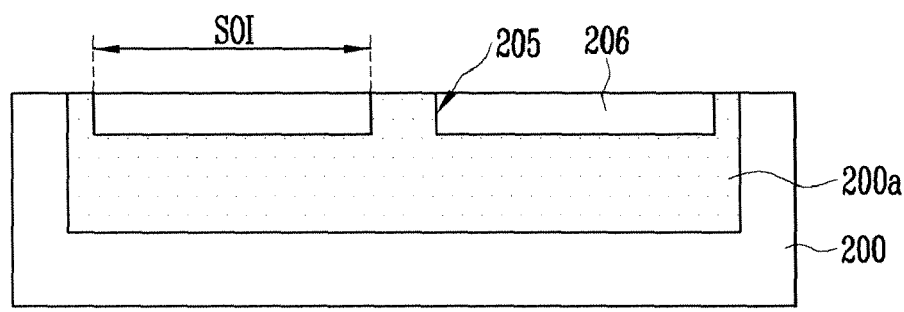

Referring to FIG. 2C, an etching process may be performed on the mask pattern 204 having the opened patterns in the cell region and the peripheral region. During the etching process, the TNW region may be etched in the semiconductor substrate 200 of the cell region and the insulating layer 200a may be etched in the semiconductor substrate 200 of the peripheral region. Thus, a difference in the etch rate occurs due to a difference in the materials of the two regions. In particular, if the etching process having a high etching selectivity with respect to silicon (Si) may be performed, the etch rate in the insulating layer 200a of the peripheral region is slower than the etch rate in the cell region and the insulating layer 200a may be etched to form a plurality trenches 205 having a shallow depth. If deep and wide trenches are formed, a subsequent pattering process may become difficult. Thus, the trenches 205 may be formed to have a shallow and narrow structure.

Alternatively, the gate mask pattern 204 may have the opened patterns only in the peripheral region. After isolation trenches (not shown) of the cell region are formed, the gate mask pattern 204 having the opened patterns through which the well regions may be exposed in the peripheral region formed on the semiconductor substrate 200. The etching process may be performed on the gate mask pattern 204, thus forming the trenches 205 in the insulating layer 200a. The trenches 205 may be formed in the regions where the wells may be formed.

After the trenches 205 are formed, the mask pattern 204 (as shown in FIG. 2B) may be removed and silicon (Si) layers 206 may be formed within the trenches 205 of the peripheral region. A CMP process may be performed in order to expose the insulating layer 200a between the silicon layers 206, thereby isolating the adjacent silicon layers 206.

SOI structures may be locally formed in the semiconductor substrate 200. An ion implantation process of implanting a P type impurity, for example, using boron (B) may be performed on the semiconductor substrate 200 including the silicon layers 206 that are isolated from each other, in order to form P type wells. The P type wells may be formed in an NMOS transistor region and an N type well may be formed in a PMOS transistor region.

Figure 2D:
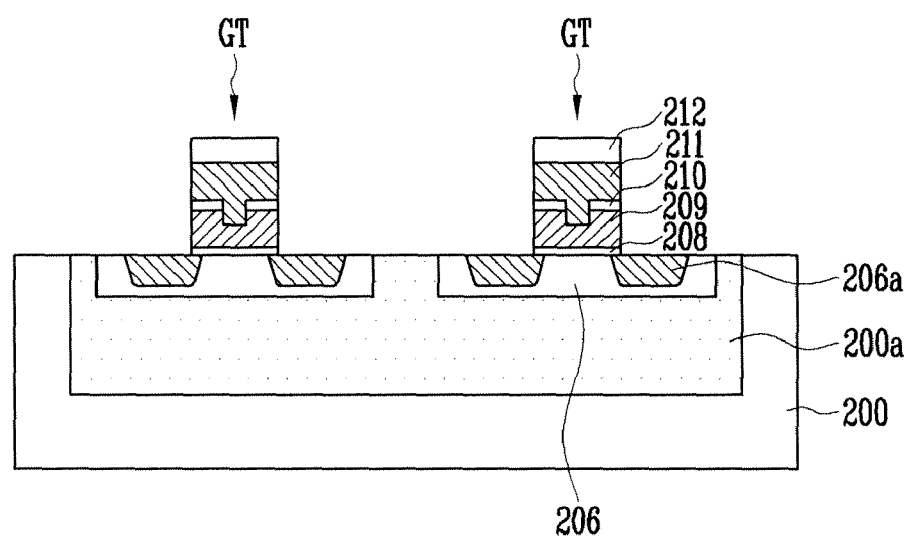

Referring to FIG. 2D, gates GT may be formed on the SOI structures of the semiconductor substrate 200. Each gate GT may be formed by laminating a gate insulating layer 208, a first conductive layer 209, a dielectric layer 210, a second conductive layer 211, and a metal layer 212. A contact hole may be formed in the dielectric layer 210 so that the first conductive layer 209 connects with the second conductive layer 211. Further, memory cells may be formed in the cell region.

A mask pattern (not shown) in which regions into which ions may be implanted are opened in the semiconductor substrate 200 having the gate (GT) patterns formed thereon. An ion implantation process using an N type impurity may be performed on the mask pattern (not shown) in order to form junctions 206a. The junctions 206a formed in the silicon layers 206 may be exposed at both sides of the gate GT. Further, the junctions 206a formed in each silicon layer 206 may be isolated from each other by the insulating layer 200a. The silicon layer 206 below a transistor (TR) pattern may become a channel region.

Meanwhile, it has been shown in the drawings that one gate may be formed in each of the isolated silicon layers 206. However, it is to be noted that one or more gates may be formed in each silicon layer 206.

The respective transistors TR may be surrounded by the insulating layer 200a through which the migration of electrons is difficult and respectively formed within the silicon layers 206 may be isolated from each other. Thus, the occurrence of capacitance between the junctions 206a may be prohibited.

As described above, according to an embodiment of the invention, insolation may be performed on the peripheral region by forming the insulating layer having a shallow and narrow structure instead of using a deep and wide STI process for insolation of the peripheral region. Accordingly, pattern failure caused by a step occurring in a subsequent pattering process may be decreased. A gap between adjacent junctions may be reduced and the level of integration may be improved. Further, since an active region including a channel region may be surrounded by the insulating layer, the occurrence of the leakage current may be reduced.

What is claimed is:

1. A method of fabricating a semiconductor device, the method comprising:
   providing a semiconductor substrate including a peripheral region and a cell region;
   forming an insulating layer within the peripheral region;
   etching a portion of the insulating layer and a portion of the semiconductor substrate in the cell region, thereby forming trenches within the insulating layer and the semiconductor substrate in the cell region;
   forming silicon layers within the trenches of the insulating layer so that the peripheral region becomes a SOI (Silicon on Insulator) structure and the cell region maintains the semiconductor substrate;
   forming gates on the SOI structure; and
   forming junctions in the SOI structure.

2. The method of claim 1, wherein the formation of the insulating layer includes:
   forming a first mask pattern in which the peripheral region is opened on the semiconductor substrate;
   forming the insulating layer by performing an ion implantation process on the semiconductor substrate exposed along the first mask pattern;
   removing the first mask pattern; and
   performing an annealing process.

3. The method of claim 2, wherein the ion implantation process is performed using oxygen ions as an impurity.

4. The method of claim 1, wherein the etching to form of the trenches is performed using a second mask pattern in which an isolation region of the cell region and the peripheral region is opened on the semiconductor substrate, and the second mask pattern is removed after the trenches are formed.

5. The method of claim 1, wherein the trenches with a depth in the peripheral region is shallower than the trenches formed in the cell region.

6. The method of claim 1, wherein when the gates are formed, memory cells are formed in the cell region.

7. A method of fabricating a semiconductor device, the method comprising:
   providing a semiconductor substrate including a peripheral region and a cell region;
   forming an insulating layer within the peripheral region;
   etching a portion of the insulating layer and a portion of the semiconductor substrate in the cell region, thereby forming trenches within the insulating layer and the semiconductor substrate in the cell region;
   and the semiconductor substrate in the cell region;
   forming silicon layers within the trenches of the peripheral region so that the peripheral region becomes a SOI (Silicon On Insulator) structure and the cell region maintains the semiconductor substrate;
   performing an ion implantation process in the silicon layers to form wells within the peripheral region;
   forming gates on the SOI structure; and
   forming junctions in the SOI structure.

8. The method of claim 7, wherein the ion implantation process includes implanting a P type impurity.

9. The method of claim 7, wherein the formation of the insulating layer includes:
   forming a first mask pattern in which the peripheral region is opened on the semiconductor substrate;
   forming the insulating layer by performing an ion implantation process on the semiconductor substrate exposed along the first mask pattern; and
   removing the first mask pattern.

10. The method of claim 7, wherein the etching to form the trenches
    is performed using a second mask pattern in which an isolation region of the cell region and the peripheral region is opened on the semiconductor substrate, and the second mask pattern is removed after the trenches are formed.

11. The method of claim 7, wherein the trenches with a depth in the peripheral region is shallower than the trenches formed in the cell region.

12. The method of claim 7, wherein when the gates are formed, memory cells are formed in the cell region.

* * * * *